(12) United States Patent
Namba et al.

(10) Patent No.: US 7,932,990 B2
(45) Date of Patent: Apr. 26, 2011

(54) EXPOSURE APPARATUS

(75) Inventors: Hisashi Namba, Utsunomiya (JP);
Tatsuya Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 354 days.

(21) Appl. No.: 11/828,814

(22) Filed: Jul. 26, 2007

(65) Prior Publication Data
US 2008/0030705 A1 Feb. 7, 2008

(30) Foreign Application Priority Data

Aug. 1, 2006 (JP) .................................. 2006-209447

(51) Int. Cl.
*G03B 27/42* (2006.01)
*G03B 27/52* (2006.01)
*G03B 27/54* (2006.01)

(52) U.S. Cl. .............................. 355/30; 355/53; 355/67
(58) Field of Classification Search .................... 355/30, 355/53, 67; 277/913, 916, 602, 606, 607, 277/626; 138/137; 378/34
See application file for complete search history.

(56) References Cited

U.S. PATENT DOCUMENTS

| 5,188,402 | A | * | 2/1993 | Colgate et al. ................ 285/332 |
| 6,198,792 | B1 | | 3/2001 | Kanouff et al. |
| 7,633,597 | B2 | * | 12/2009 | Namba et al. ................... 355/30 |
| 2001/0050759 | A1 | * | 12/2001 | Kamiya .......................... 355/30 |
| 2005/0069433 | A1 | * | 3/2005 | Hayashi ..................... 417/423.4 |
| 2006/0215137 | A1 | * | 9/2006 | Hasegawa et al. .............. 355/53 |
| 2007/0103660 | A1 | * | 5/2007 | Tanaka ............................ 355/53 |

FOREIGN PATENT DOCUMENTS

| JP | 04136943 A * | 5/1992 |
| JP | 2005-113977 A | 4/2005 |
| JP | 2005-347582 A | 12/2005 |
| JP | 2006269942 A * | 10/2006 |
| WO | WO 2006075575 A1 * | 7/2006 |

* cited by examiner

*Primary Examiner* — Hung Henry Nguyen
*Assistant Examiner* — Colin Kreutzer
(74) *Attorney, Agent, or Firm* — Canon USA Inc. IP Divsion

(57) ABSTRACT

An exposure apparatus includes a projection optical system that projects a pattern of a reticle onto a wafer, a vacuum chamber in which the projection optical system is disposed, a partition provided in the vacuum chamber and dividing a first space (which is a space where at least a portion of the projection optical system exists) and a second space (which is a space other than the first space) from each other, a gas supplying unit that supplies gas to the first space, and a sealant that reduces flow of the gas supplied through a pipe into the second space.

6 Claims, 4 Drawing Sheets

100 # EXPOSURE APPARATUS

BACKGROUND OF THE INVENTION

1. Field of the Invention

The present invention relates to an exposure apparatus including a vacuum chamber.

2. Description of the Related Art

A method of producing a minute semiconductor device such as a logical circuit or a semiconductor memory using photolithography techniques is known. In this method, a circuit pattern, formed on a reticle (mask), is projected and transferred onto a substrate, such as a wafer, using a reduction projection exposure apparatus.

A minimum size (resolution) that can be transferred in the reduction projection exposure apparatus is proportional to the wavelength of exposure light, and is inversely proportional to the numerical aperture (NA) of a projection optical system. Therefore, the shorter the wavelength, the higher the resolution. Consequently, a demand for minuter semiconductor devices in recent years is reducing the wavelength of exposure light that is used. For example, exposure light having wavelengths that are shorter than those of an i line ($\lambda$=approximately 365 nm) of an ultra-high pressure mercury lamp, KrF excimer laser light ($\lambda$=approximately 248 nm), and ArF excimer laser light ($\lambda$=approximately 193 nm) is used.

However, since semiconductor devices are rapidly becoming minuter, lithography techniques using ultraviolet light has limitations. Therefore, to efficiently transfer a very minute circuit pattern of 0.1 µm or less, a reduction projection exposure apparatus (EUV exposure apparatus) using extreme ultraviolet light (EUV light) having a wavelength $\lambda$ of approximately 10 to 15 nm, which is shorter than that of ultraviolet light, is being developed.

Since, in the wavelength range of the EUV light, attenuation of energy due to gas is extremely large, a vacuum needs to be produced in the exposure apparatus. In addition, since impurities and oxygen in the gas may adhere as carbon compounds to an optical element due to photochemical reaction, partial pressure of the carbon compounds in the exposure apparatus needs to be low. The partial pressure of the carbon compounds needs to be very low particularly in a projection optical system space.

PCT Japanese Translation Patent Publication No. 2002-529927 (corresponding to U.S. Pat. No. 6,198,792) discloses a technology for preventing the flow of carbon compounds into a projection optical system space. More specifically, it discloses a method of restricting the flow of carbon compounds from a stage space by maintaining the pressure in the projection optical system space higher than that around the projection optical system space as a result of forming another space by surrounding the projection optical system space by a plate.

To maintain the pressure in the projection optical system space higher than that around the projection optical system space, gas needs to be supplied to the projection optical system space. The gas may be supplied to the projection optical system space by supplying the gas using a nozzle from outside an apparatus through a pipe. However, when atmospheric-pressure gas is supplied to a space whose pressure is equal to or less than 100 Pa, even if an orifice or an aperture is formed in the pipe, the gas flows into the projection optical system space at a considerably high flow rate. Therefore, vibration occurs in the pipe. When, in such a state, the pipe is directly joined to a partition defining the projection optical system space, the vibration of the pipe is transmitted to the projection optical system, thereby reducing the precision with which a pattern is transferred.

When, to prevent the vibration of the pipe from being transmitted, the pipe and the partition defining the projection optical system space are simply separated from each other so as not to contact each other, the amount of gas leaking from a gap between the pipe and the partition is increased. As a result, it is difficult to set the pressure in the projection optical system space higher than that around the projection optical system space.

SUMMARY OF THE INVENTION

The present invention makes it possible to maintain the pressure in a projection optical system space higher than that of a space around the projection optical system space, and prevent vibration occurring in a pipe, which supplies gas into the projection optical system space, from being transmitted to a projection optical system.

According to the present invention, an exposure apparatus includes a projection optical system configured to project a pattern of a reticle onto a wafer, a vacuum chamber in which the projection optical system is disposed, a partition provided in the vacuum chamber and dividing a first space (which is a space where at least a portion of the projection optical system exists) and a second space (which is a space other than the first space) from each other, a gas supplying unit that supplies gas to the first space, and a sealant that reduces flow of the gas supplied through a pipe into the second space.

Further features and aspects of the present invention will become apparent from the following description of exemplary embodiments with reference to the attached drawings.

DESCRIPTION OF THE EMBODIMENTS

The present invention will be described in detail with reference to various illustrated embodiments of the present invention.

First Exemplary Embodiment

Figure 1:
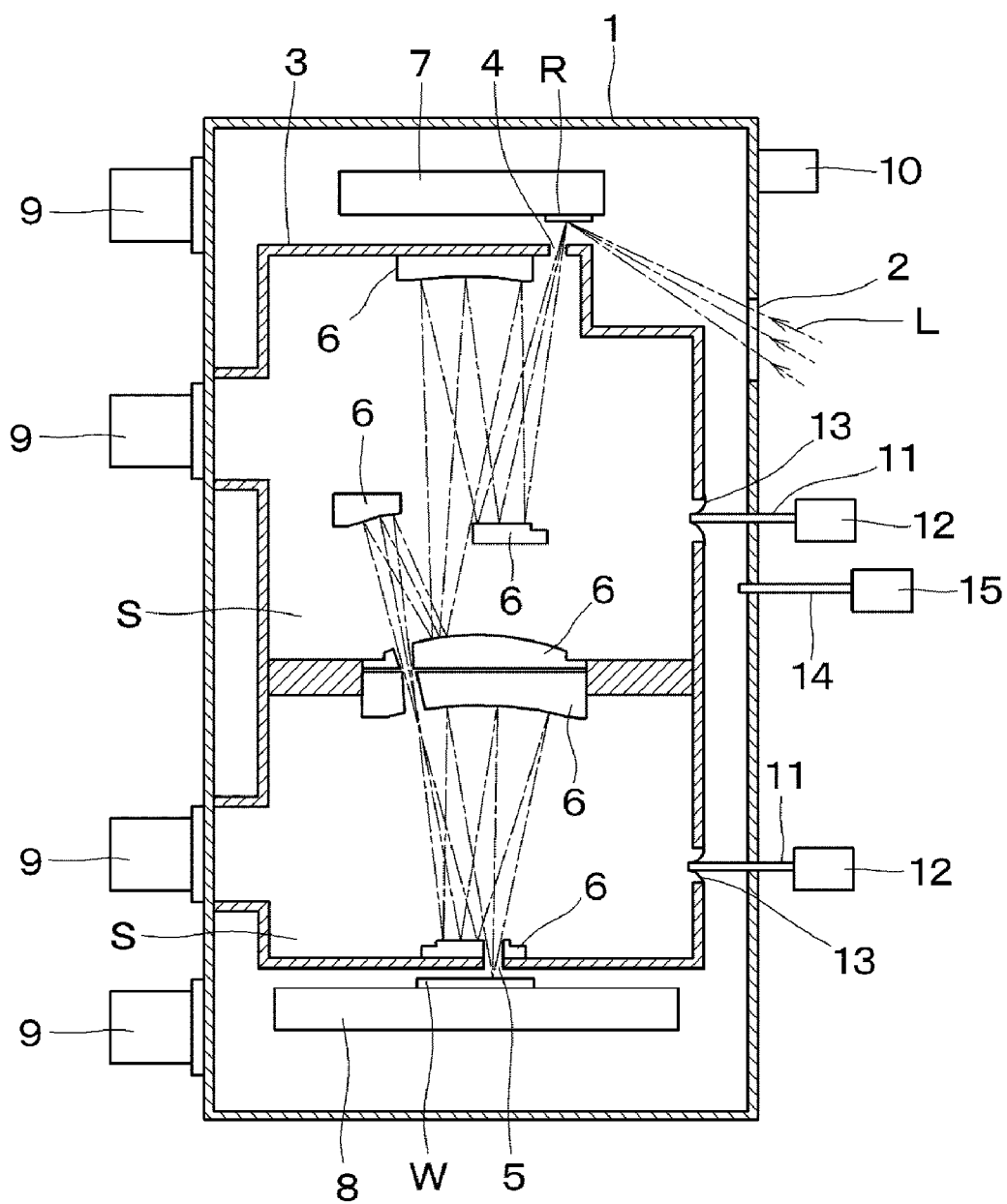
FIG. 1 shows an example structure of an exposure apparatus according to a first exemplary embodiment of the present invention.
Figure 2:
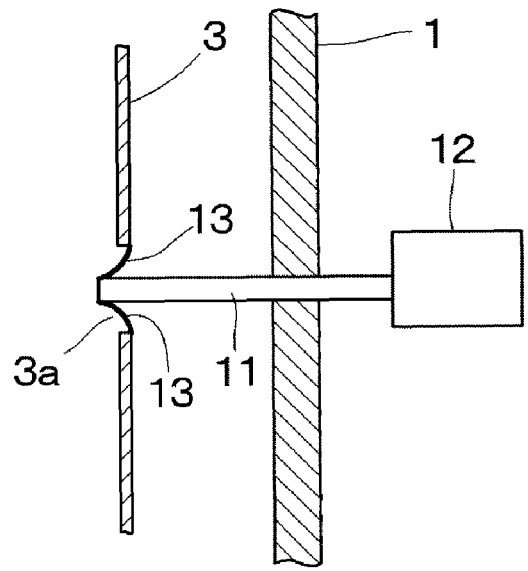
FIG. 2 is a partial enlarged sectional view of a vibration isolation mechanism according to the first embodiment.

FIG. 1 is a partial structural view of an exposure apparatus according to a first embodiment of the present invention. FIG. 2 is a partial enlarged sectional view of a vibration isolation mechanism.

In FIG. 1, reference numeral 1 denotes a vacuum chamber. A window 2 for transmitting exposure light L, guided by an illumination system (not shown), is provided in a side surface of the vacuum chamber 1. The illumination system (not shown) is also provided in the vacuum chamber 1. A partition 3 for forming a space (projection optical system space) S, where a projection optical system exists, is disposed in the vacuum chamber 1. Openings 4 and 5 for transmitting the exposure light L are formed in the partition 3. A plurality of reflecting mirrors 6 of the projection optical system for transferring a pattern are disposed in the projection optical system space S. A reticle stage 7 that holds a reticle R is accommodated above the opening 4 in the vacuum chamber 1. A wafer W, which is placed on a wafer stage 8, is accommodated below the opening 5 in the vacuum chamber 1. The exposure light L from the illumination system is reflected by the reticle R, passes through the opening 4, and is reflected by each of the reflecting mirrors 6 of the projection optical system. Then, the exposure light L passes through the opening 5 to transfer a pattern of the reticle R onto the wafer W on the wafer stage 8.

A plurality of turbo molecular pumps 9 and a pressure sensor 10 are mounted to respective wall surfaces of the vacuum chamber 1. The turbo molecular pumps 9 discharge gas from the inner portions of the projection optical system space S and the vacuum chamber 1 so that the inner portions are in a vacuum state. The pressure sensor 10 measures the pressure in the vacuum chamber 1. Gas supply pipes 11 are inserted in the side wall 3 and the corresponding wall surface of the vacuum chamber 1 from outside the vacuum chamber 1. The gas supply pipes 11 are connected to gas supply units 12 outside the vacuum chamber 1. The partition 3 has holes 3a (see FIGS. 2 and 3) in which the respective gas supply pipes 11 are inserted and which have diameters that are larger than those of the gas supply pipes 11. Sealants 13, which are formed of any one of a metallic foil, resin, and a film, for increasing air tightness are mounted between the separation wall 3 and each of the gas supply pipes 11.

The partition 3 and the gas supply pipes 11 are connected to each other through the sealants 13, but are not directly in contact with each other. Since the sealants 13 are formed of any one of a metallic foil, resin, and a film, they have very low rigidity. Therefore, vibration that is transmitted from the gas supply pipes 11 to the partition 3 is negligible.

The pressure in the projection optical system space S during exposure is equal to or less than 10 Pa. The pressure in a space around the projection optical system space S is approximately $10^{-5}$ Pa. For example, the diameter of each gas supply pipe 11 is 10 mm, and the diameter of each hole 3a, formed in the partition 3 for passing its associated gas supply pipe 11 therethrough, is approximately 12 mm. A force exerted upon each sealant 13 and produced due to a pressure difference is approximately 0.5 gf, and can be satisfactorily withstood by a metallic foil, resin, and a film.

A gas supply pipe 14 for a vacuum chamber is inserted in the vacuum chamber 1, and is connected to a gas supply unit 15 outside the vacuum chamber 1.

When using the exposure apparatus, first, the vacuum chamber 1 is evacuated using the turbo molecular pumps 9. Then, the gas supply unit 12 is controlled to maintain the pressure in the projection optical system space S higher than the pressure around the projection optical system space S.

Gas supplied into the projection optical system space S moves out of the projection optical system space S through the openings 4 and 5. Here, the flow of the gas through the openings 4 and 5 is from the inside to the outside of the partition 3, so that it is possible to reduce the flow of a carbon compound into the projection optical system space S from the outside of the projection optical system space S.

The gas is supplied into the projection optical system space S from outside the exposure apparatus through the gas supply pipes 11. The gas supplied through the gas supply pipes 11 is supplied into the projection optical system space S at a high speed. As mentioned above, the partition 3 has the holes 3a in which the respective gas supply pipes 11 are inserted, and the gas supply pipes 11 and the partition 3 are not directly in contact with each other.

Accordingly, another space is formed by surrounding the projection optical system space S with the partition 3, and the pressure in the projection optical system space S is maintained higher than the pressure around the projection optical system space S. Therefore, it is possible to restrict the flow of a carbon compound into the projection optical system space S from a stage space of the vacuum chamber 1.

Accordingly, the gist of the present invention is that the flow of, for example, a carbon compound into the space, where an optical member exists, is restricted after isolating the vibration of the pipes. Therefore, various modifications may be made without departing from the scope of the gist of the present invention.

For example, although in the first embodiment, all the reflecting mirrors 6 of the projection optical system are provided within the partition 3, the projection optical system space S may be divided into a plurality of spaces. Alternatively, at least a portion of the projection optical system may be provided in the space in the partition. Even in these modifications, advantages regarding, for example, isolation of the vibration of the pipes and the flow of impurities into the space are provided for the optical elements in the partition, so that these modifications do not depart from the gist of the present invention.

In addition, although in the first embodiment, the difference between the pressure in the projection optical system space S and the pressure of the stage space is made large using the sealants 13, the partition 3 and the gas supply pipes 11 may be separated from each other without using the sealants 13. That is, even if gaps are formed between the partition 3 and each of the gas supply pipes 11, their intervals are small, such as equal to or less than 5 mm. Therefore, conductance is small, so that the difference between the pressures inside and outside the partition 3 can be maintained.

Second Exemplary Embodiment

Figure 3:
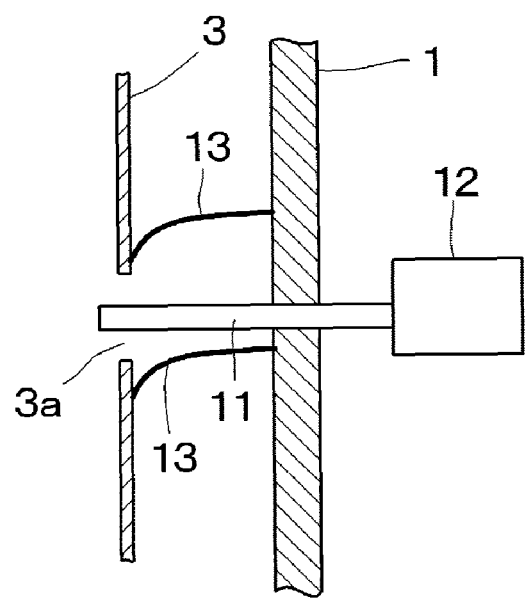
FIG. 3 is a partial enlarged sectional view of a vibration isolation mechanism according to a second exemplary embodiment of the present invention.

FIG. 3 is a partial enlarged sectional view of a vibration isolation mechanism for a vacuum chamber 1 and a partition 3 according to a second embodiment. Parts corresponding to those of the first embodiment are given the same reference numerals.

In the second embodiment, instead of the sealants 13 being in direct contact with the gas supply pipes 11, cylindrical sealants 13 surround and cover gas supply pipes 11, so that a vacuum chamber 1 and the inner portion of a partition 3 are isolated from each other.

Accordingly, since the gas supply pipes 11 are not in contact with the partition 3, vibration of the gas supply pipes 11 is not transmitted to the partition 3. Even in the second embodiment, the same operational advantages as those in the first embodiment are provided.

Third Exemplary Embodiment

Figure 4:
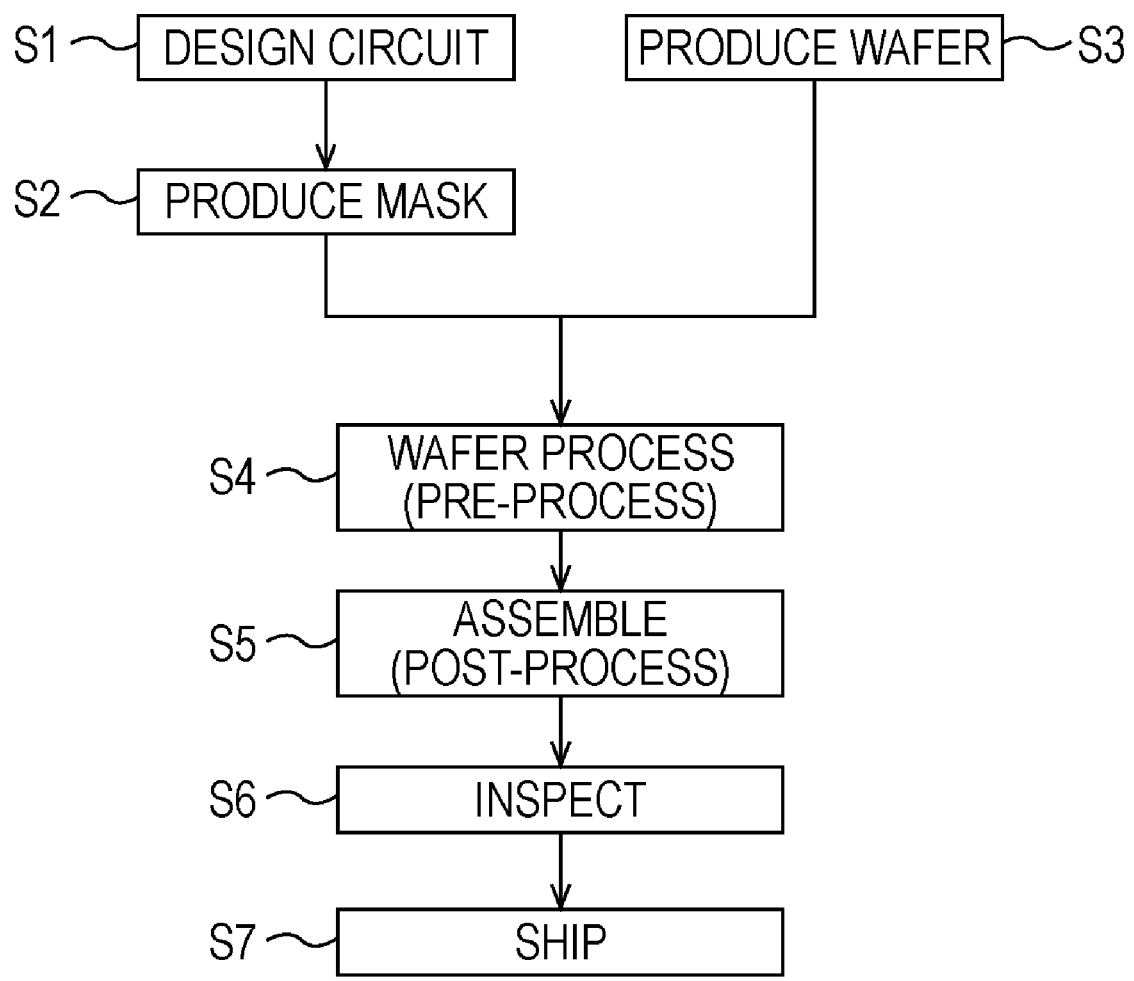
FIG. 4 is a flowchart of an example method of producing a semiconductor device according to a third embodiment.

FIG. 4 is a flowchart of a method of producing a semiconductor device, such as a charge-coupled device (CCD), a liquid crystal panel, or a semiconductor chip, including an integrated circuit (IC) or a large-scale integrated circuit (LSI), using the exposure apparatus shown in FIG. 1.

First, in Step S1, a circuit pattern of a semiconductor device is designed. In Step S2, a mask (reticle R) having formed thereon the circuit pattern designed in Step S1 is produced. In Step S3, a wafer W is produced using, for example, silicon.

In Step S4 (a wafer process step or a pre-processing step), the mask produced in Step S2 and the wafer produced in Step S3 are used to form an actual circuit on the wafer W using lithography techniques. Then, in Step S5 (an assembly step or a post-processing step), the wafer W having the actual circuit formed thereon in Step S4 is formed into a chip, in which assembly (dicing and bonding), packaging (of the chip), etc., are performed.

In Step S6, the semiconductor device prepared in Step S5 is inspected by conducting operation confirmation and durability tests. Then, in Step S7, the semiconductor device that is completed as a result of performing the Steps S1 to S6 is shipped.

Figure 5:
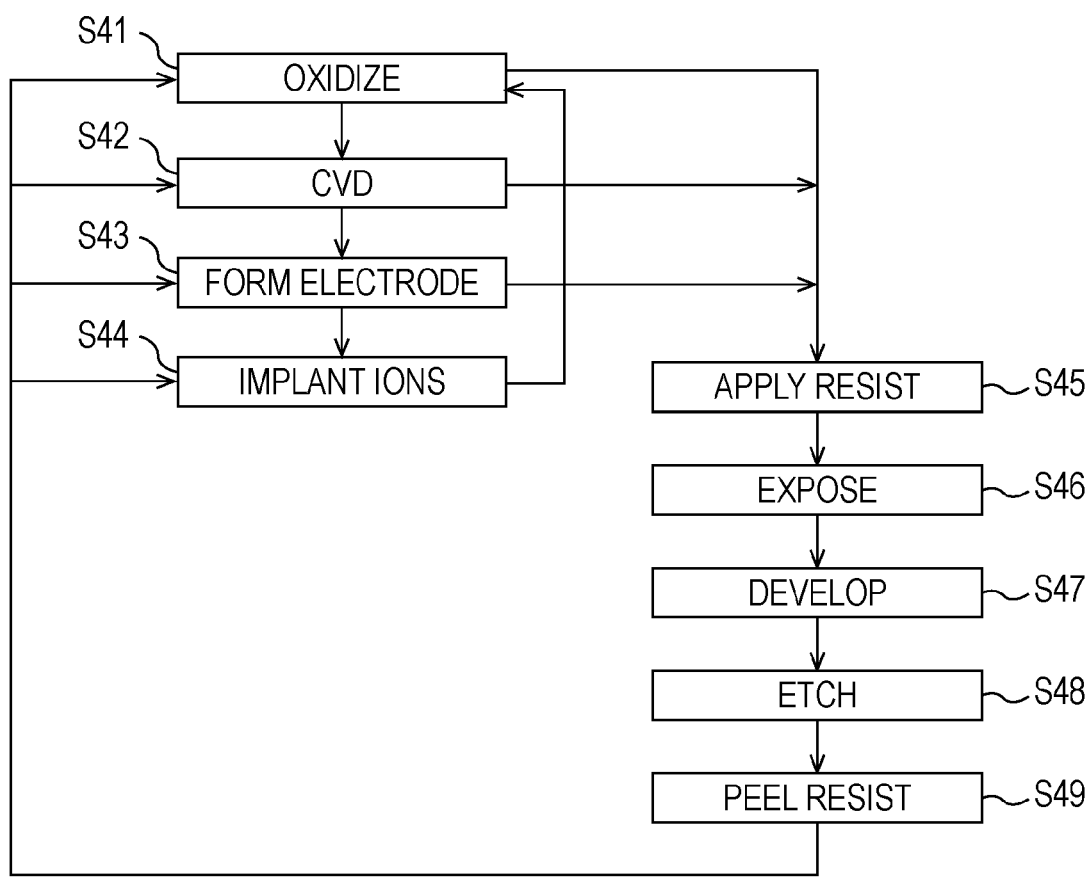
FIG. 5 is a flowchart of a wafer process.

FIG. 5 is a detailed flowchart showing the above-described wafer process of Step S4 illustrated in FIG. 4. In Step S41, a surface of the wafer W is oxidized. Then, in Step S42, an insulation film is formed on the surface of the wafer W by the chemical-vapor deposition (CVD) method. In Step S43, an electrode is formed on the wafer W by evaporation. In Step S44, ions are implanted into the wafer W.

In Step S45, a resist is applied to the wafer W. In Step S46, the wafer W is exposed to an image of the mask (reticle R) circuit pattern using the above-described exposure apparatus. In Step S47, the exposed wafer W is developed. In Step S48, portions other than where the developed resist exists are etched. In Step S49, any unnecessary resist is removed after the etching. These steps are repeated to form circuit patterns on the wafer W.

Using the device producing method according to the embodiment makes it possible to produce a highly integrated semiconductor device, which is difficult to produce by a related device producing method.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-209447 filed Aug. 1, 2006, which is hereby incorporated by reference herein in its entirety.

What is claimed is:

1. An exposure apparatus, comprising:
a projection optical system configured to project a pattern of a reticle onto a wafer;
a reticle stage configured to hold the reticle;
a wafer stage configured to hold the wafer;
a vacuum chamber in which the projection optical system, the reticle stage, and the wafer stage are accommodated;
a partition provided in the vacuum chamber, the partition dividing a projection optical system space, where optical elements of the projection optical system are disposed, from a stage space, where the reticle stage and the wafer stage are accommodated, the partition having openings for transmitting an exposure light near the reticle and the wafer;
a gas supplying unit configured to supply gas to the projection optical system space through a pipe so that a pressure in the projection optical system space is higher than a pressure in the stage space, wherein the pipe is disposed through a hole formed in the partition, wherein the pipe is not in contact with the partition, and wherein an end of the pipe is disposed within the projection optical system space; and
a sealant configured to seal a gap between the partition and the pipe in the hole, wherein one end of the sealant is connected to the partition and another end of the sealant is connected to the pipe within the projection optical system space, the sealant preventing transmission of vibration of the pipe to the projection optical system via the partition, and wherein the vibration is generated when the gas supplying unit supplies the gas to the projection optical system space.

2. The exposure apparatus according to claim 1, wherein the sealant is formed of any one of a metallic foil, resin, or a film.

3. A device producing method, comprising:
transferring a reticle pattern onto a wafer by exposure using the exposure apparatus according to claim 1; and
developing the wafer on which the reticle pattern is transferred by the exposure.

4. An exposure apparatus, comprising:
a projection optical system configured to project a pattern of a reticle onto a wafer;
a reticle stage configured to hold the reticle;
a wafer stage configured to hold the wafer;
a vacuum chamber in which the projection optical system, the reticle stage, and the wafer stage are accommodated;
a partition provided in the vacuum chamber, the partition dividing a projection optical system space, where optical elements of the projection optical system are disposed, from a stage space, where the reticle stage and the wafer stage are accommodated, the partition having openings for transmitting an exposure light near the reticle and the wafer, the stage space surrounding the projecting optical system space;
a gas supplying unit configured to supply gas to the projection optical system space through a pipe so that a pressure in the projection optical system space is higher than a pressure in the stage space, wherein the pipe is disposed through the vacuum chamber, the stage space and a hole formed in the partition, and wherein the pipe is not in contact with the partition; and
a sealant, wherein one end of the sealant is connected to an outer surface of the partition and another end of the sealant is connected to an inner surface of the vacuum chamber in such a way that the sealant covers the pipe, the sealant preventing transmission of vibration of the pipe to the projection optical system via the partition, and wherein the vibration is generated when the gas supplying unit supplies the gas to the projection optical system space.

5. An exposure apparatus, comprising:
a projection optical system configured to project a pattern of a reticle onto a wafer;
a reticle stage configured to hold the reticle;
a vacuum chamber in which the projection optical system and the reticle stage are accommodated;
a partition provided in the vacuum chamber, the partition dividing a projection optical system space, where optical elements of the projection optical system are disposed, from a stage space, where the reticle stage is accommodated, the partition having an opening for transmitting exposure light near the reticle;
a gas supplying unit configured to supply gas to the projection optical system space through a pipe so that a pressure in the projection optical system space is higher than a pressure in the stage space, wherein the pipe is disposed through a hole formed in the partition, wherein the pipe is not in contact with the partition, and wherein an end of the pipe is disposed within the projection optical system space; and
a sealant configured to seal a gap between the partition and the pipe in the hole, wherein one end of the sealant is connected to the partition and another end of the sealant is connected to the pipe within the projection optical system space, the sealant preventing transmission of vibration of the pipe to the projection optical system via the partition, and wherein the vibration is generated when the gas supplying unit supplies the gas to the projection optical system space.

6. An exposure apparatus, comprising:

a projection optical system configured to project a pattern of a reticle onto a wafer;

a wafer stage configured to hold the wafer;

a vacuum chamber in which the projection optical system and the wafer stage are accommodated;

a partition provided in the vacuum chamber, the partition dividing a projection optical system space, where optical elements of the projection optical system are disposed, from a stage space, where the wafer stage is accommodated, the partition having an opening for transmitting exposure light near the wafer;

a gas supplying unit configured to supply gas to the projection optical system space through a pipe so a pressure in the projection optical system space is higher than a pressure in the stage space, wherein the pipe is disposed through a hole formed in the partition, wherein the pipe is not in contact with the partition, and wherein an end of the pipe is disposed within the projection optical system space; and a sealant configured to seal a gap between the partition and the pipe in the hole, wherein one end of the sealant is connected to the partition and another end of the sealant is connected to the pipe within the projection optical system space, the sealant preventing transmission of vibration of the pipe to the projection optical system via the partition, and wherein the vibration is generated when the gas supplying unit supplies the gas to the projection optical system space.

* * * * *